(12) United States Patent
Schmiege et al.

(10) Patent No.: US 10,233,547 B2
(45) Date of Patent: *Mar. 19, 2019

(54) METHODS OF ETCHING FILMS WITH REDUCED SURFACE ROUGHNESS

(71) Applicant: Applied Materials, Inc., Santa Clara, CA (US)

(72) Inventors: Benjamin Schmiege, Santa Clara, CA (US); Nitin K. Ingle, Santa Clara, CA (US); Srinivas D. Nemani, Sunnyvale, CA (US); Jeffrey W. Anthis, San Jose, CA (US); Xikun Wang, Sunnyvale, CA (US); Jie Liu, Sunnyvale, CA (US); David Benjaminson, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/899,234

(22) Filed: Feb. 19, 2018

(65) Prior Publication Data

US 2018/0195179 A1    Jul. 12, 2018

Related U.S. Application Data

(63) Continuation of application No. 15/383,556, filed on Dec. 19, 2016, now Pat. No. 9,896,770, which is a continuation of application No. 14/793,977, filed on Jul. 8, 2015, now Pat. No. 9,540,736.

(60) Provisional application No. 62/030,232, filed on Jul. 29, 2014.

(51) Int. Cl.
    *C23F 1/12*    (2006.01)
    *C30B 33/12*   (2006.01)
    *C23F 4/00*    (2006.01)
    *H01J 37/32*   (2006.01)

(52) U.S. Cl.
    CPC .................. *C23F 1/12* (2013.01); *C23F 4/00* (2013.01); *C30B 33/12* (2013.01); *H01J 37/32009* (2013.01); *H01J 2237/334* (2013.01)

(58) Field of Classification Search
    CPC ........................................................ C23F 1/12
    USPC ............................................................. 216/100
    See application file for complete search history.

*Primary Examiner* — Roberts P Culbert
(74) *Attorney, Agent, or Firm* — Servilla Whitney LLC

(57) ABSTRACT

Provided are methods for etching films comprising transition metals which help to minimize higher etch rates at the grain boundaries of polycrystalline materials. Certain methods pertain to amorphization of the polycrystalline material, other pertain to plasma treatments, and yet other pertain to the use of small doses of halide transfer agents in the etch process.

19 Claims, 3 Drawing Sheets

METHODS OF ETCHING FILMS WITH REDUCED SURFACE ROUGHNESS

CROSS-REFERENCE TO RELATED APPLICATION

This application is a continuation of U.S. patent application Ser. No. 15/383,556, filed Dec. 19, 2016, which is a continuation of U.S. patent application Ser. No. 14/793,977, filed Jul. 8, 2015, now U.S. Pat. No. 9,540,736, which claims priority to U.S. Provisional Application No. 62/030,232, filed Jul. 29, 2014, the entire disclosures of which are hereby incorporated by reference.

TECHNICAL FIELD

Aspects of the present invention relates generally to methods of etching films. In particular, aspects of the invention relates to etching films comprising transition metals for semiconductor devices.

BACKGROUND

Deposition of films on a substrate surface is an common process in a variety of industries including semiconductor processing, diffusion barrier coatings and dielectrics for magnetic read/write heads. Chemical vapor deposition (CVD) and atomic layer deposition (ALD) are two deposition processes used to form or deposit various materials on a substrate. In general, CVD and ALD processes involve the delivery of gaseous reactants to the substrate surface where a chemical reaction takes place under temperature and pressure conditions favorable to the thermodynamics of the reaction. Additionally, in the semiconductor industry, miniaturization benefits from atomic level control of thin film deposition to produce conformal coatings on high aspect structures. One method for deposition of thin films with control and conformal deposition is atomic layer deposition (ALD), which employs sequential, surface reactions to form layers of precise thickness. Most ALD processes are based on binary reaction sequences which deposit a binary compound film. Because the surface reactions are sequential, the two gas phase reactants are not in contact, and possible gas phase reactions that may form and deposit particles are limited.

However, before the present invention, there has not been a commercially available way to delicately etch films with control and conformality. For example, while there have been wet etch methods proposed for cobalt, there is still a need for dry methods to remove cobalt and/or cobalt residue, and preferably in situ methods that are self-limiting and allow for precise control over etch rate. Even more particularly, there is a need for a method that is selective for a particular metal, which would provide even more control over the etching process.

SUMMARY

One aspect of the invention pertains to a method of etching a substrate, the method comprising:
providing a polycrystalline film comprising a transition metal;
amorphizing at least a portion of the polycrystalline film to provide an amorphous layer;
exposing the amorphous layer to a halide transfer agent to provide an activated substrate surface; and
exposing the activated substrate surface to a reagent comprising a Lewis base or pi acid to provide a vapor phase coordination complex comprising one or more atoms of the transition metal coordinated to one or more ligands from the reagent.

Another aspect of the invention pertains to a method of etching a substrate, the method comprising:
providing a polycrystalline film comprising a transition metal;
exposing the polycrystalline film to an inert plasma, reducing gas or reagent vapor;
exposing the polycrystalline film to a halide transfer agent to provide an activated substrate surface; and
exposing the activated substrate surface to a reagent comprising a Lewis base or pi acid to provide a vapor phase coordination complex comprising one or more atoms of the transition metal coordinated to one or more ligands from the reagent.

Another aspect of the invention pertains to a method of etching a substrate, the method comprising:
activating a substrate surface comprising a polycrystalline film of a metal selected from the group consisting of Co, Cu, Ru, Ni, Fe, Pt, Mn and Pd, wherein activation of the substrate surface comprises exposing the substrate surface to $Br_2$ or $Cl_2$ to provide an activated substrate surface; and
exposing the activated substrate surface to a reagent comprising TMEDA to provide a vapor phase coordination complex comprising one or more atoms of the Co, Cu, Ru, Ni, Fe, Pt, Mn or Pd coordinated to one or more ligands from the reagent, wherein the $Br_2$ is present in an amount effective to etch about one Angstrom of the substrate surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. However, the appended drawings illustrate only typical embodiments of this invention and are therefore not to be considered limiting of its scope, for the invention may admit to other equally effective embodiments.

DETAILED DESCRIPTION

Figure 1:
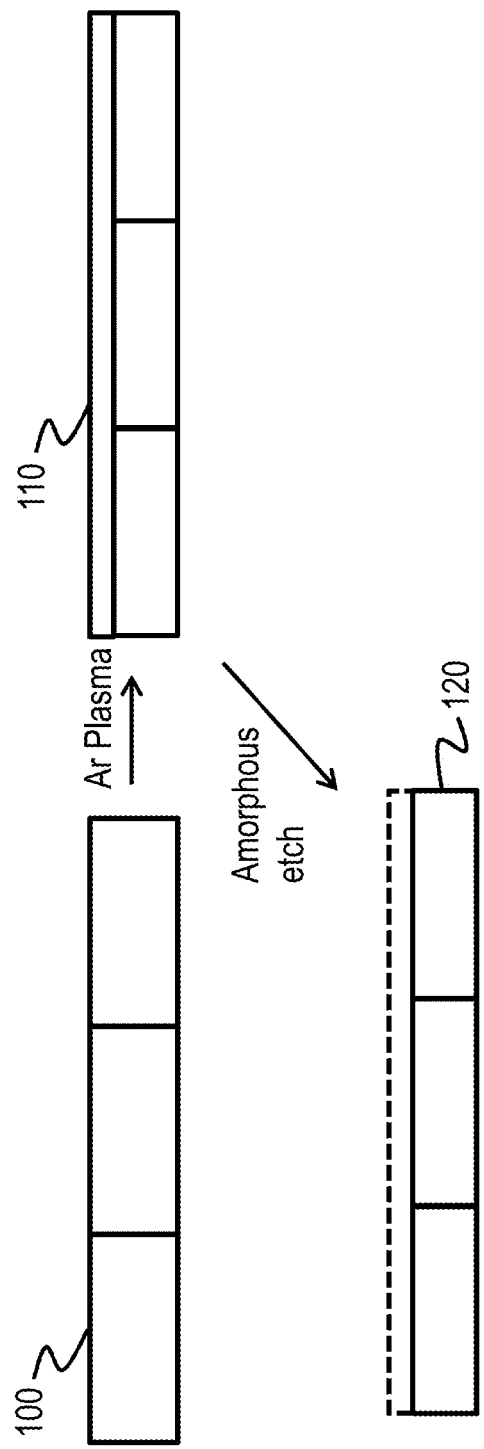
FIG. 1 shows a schematic of a method in accordance with one or more embodiments of the invention.

Before describing several exemplary embodiments of the invention, it is to be understood that the invention is not limited to the details of construction or process set forth in the following description. The invention is capable of other embodiments and of being practiced or being carried out in various ways. It is also to be understood that the complexes and ligands of the present invention may be illustrated herein using structural formulas which have a particular stereochemistry. These illustrations are intended as examples only and are not to be construed as limiting the disclosed structure to any particular stereochemistry, unless otherwise indicated. Rather, the illustrated structures are intended to encompass all such complexes and ligands having the indicated chemical formula.

Etching processes can result in a very uneven surface post-etch. Resulting surfaces may have a pitted and rough surface, or with a smooth but uneven surface. If the layer to be etched has crystalline grains the etch effects may be exacerbated at grain boundaries. Therefore a rough surface may result, which may not be suitable for certain semiconductor applications. While not wishing to be bound to any particular theory, it is thought that the varying etch rates is most likely due to deeper penetration of certain reagents (i.e., halide) into the boundaries. Depending on the type of substrate and the how the etch process is carried out one of the reagents, often a halogen-containing reagent, can migrate much further into the bulk of the film. This tendency to penetrate the film is accentuated by certain film defects, differing crystal faces and grain boundaries. It has been discovered that certain treatments before and during the etch process, or certain modifications to the etch process, can have the advantage of minimizing the differing etch rates. Such processes also result in smooth, conformal etched surfaces.

Accordingly, one aspect of the invention pertains to a method of etching a substrate. First, a polycrystalline film comprising a transition metal is provided. The method also comprises amorphizing at least a portion of the polycrystalline film to provide an amorphous layer. Then, the amorphous layer may be exposed to a halide transfer agent to provide an activated substrate surface. The activated substrate surface may then be exposed to a reagent comprising a Lewis base or pi acid to provide a vapor phase coordination complex comprising one or more atoms of the transition metal coordinated to one or more ligands from the reagent.

A "substrate" as used herein broadly covers polycrystalline films comprising one or more transition metals. In one or more embodiments, the substrate surface comprises at least one transition metal. In one or more embodiments, the transition metal comprises a first row transition metal. In one or more embodiments, the polycrystalline film comprises a metal selected from the group consisting of Co, Cu, Ru, Ni, Fe, Pt, Mn and Pd. In some embodiments, the substrate surface consists essentially of the transition metal. In one or more embodiments, the substrate surface may comprise more than one transition metal, including metal alloys. An example of such a substrate includes a substrate comprising both cobalt and iron. In other embodiments, the substrate surface comprises at least one transition metal, but also comprises other components. Other components may include carbon. In one or more embodiments, the substrate surface comprises about 90 to about 100% transition metal and 0 to about 10% carbon. Carbide films may be especially seen in embodiments relating to the removal of transition metal carbides deposited onto deposition chamber walls, showerheads, and other equipment components. In some embodiments, the other components may include oxygen, boron, sulfur and/or nitrogen. Therefore, other examples of suitable substrate comprise materials include metal alloys/intermetallics, metal oxides, metal borides, metal sulfides, metal nitrides, metal intermetallic borides, metal intermetallic oxides, metal intermetallic sulfides and metal intermetallic nitrides. To be clear, the above encompasses substrate comprising more than one transition metal as well as additional components. An example of such a material is a substrate comprising cobalt, iron and boron (CoFeB).

In some embodiments, the term includes equipment that has a layer of buildup deposited thereon. A common problem with one or more of these deposition processes is the unwanted deposition onto deposition chamber walls, showerhead, etc. Thus, in some embodiments, the substrate comprises deposited metal overlying a deposition chamber wall, a deposition showerhead, etc. In one or more embodiments, the term refers to any substrate or material surface comprising a transition metal that is formed on a second substrate upon which film processing is performed during a fabrication process. Substrates may be exposed to a pretreatment process to polish, etch, reduce, oxidize, hydroxylate, anneal and/or bake the substrate surface.

The term "substrate surface" refers to an exposed surface of the substrate. In one or more embodiments, and as the context dictates, as layers are added to the substrate or (in the alternative) part of the substrate is removed, the newly exposed surface becomes the substrate surface.

As discussed above, amorphization is used to achieve more conformal etching. As used herein "amorphization" refers to a process of converting at least part of a polycrystalline material into an amorphous one (i.e., one with no long-range order). In one or more embodiments, amorphization comprises exposing the polycrystalline film to a plasma. In further embodiments, the plasma utilized is a direct plasma of Ar or $H_2$. The depth of amorphization can be controlled by varying the time and intensity of the plasma according to known methods. Another example of a suitable plasma includes an inert gas plasma (e.g., $N_2$).

In one or more embodiments, exposing the amorphous layer to the halide transfer agent and exposing the activated substrate surface to the reagent etches the amorphous layer, and the amorphous layer is partially etched.

In some embodiments, exposing the amorphous layer to the halide transfer agent and exposing the activated substrate surface to the reagent etches the amorphous layer, and the amorphous layer is substantially etched. As used herein, "substantially etched" refers to at least 90, 95, 98, 99 or 100% removal. In such a method, a process regime can be used in which the etch rate of amorphous material is much higher than the etch rate of polycrystaline material. In this case, the etch rate would be controlled by the depth of the amorphous layer and a smooth film will be obtained.

In one or more embodiments, the method further comprises repeating exposing the amorphous layer to the halide transfer agent and exposing the activated substrate surface to the reagent. In further embodiments, the polycrystalline film is amorphous more than a targeted amount, or as deeply as possible (e.g., ~5 to 10 nm). Then only a part of the amorphous layer is etched, and the etch depth is controlled using the known etch rate of amorphous Co rather than relying on a self-limited stop on the crystalline film.

Several processes will be exemplified below and in the figures. It is to be understood that the structures shown are representative of the chemical mechanisms that are thought to be occurring during the etch process. However, they are not intended to be limiting, and other chemical structures may occur.

FIG. 1 illustrates an exemplary process in accordance with one or more embodiments of the invention. Specifically, an etching process using amorphization is shown. First, a substrate of polycrystalline cobalt 100 is provided. The surface is exposed to a plasma (e.g., Ar plasma) which provides an amorphous region 110. The amorphous region 110 is then etched, leaving behind etched polycrystalline substrate 120. The etching process can be carried out, for example, by exposing the amorphous region 110 to $Br_2$ and TMEDA as discussed above.

Figure 2:
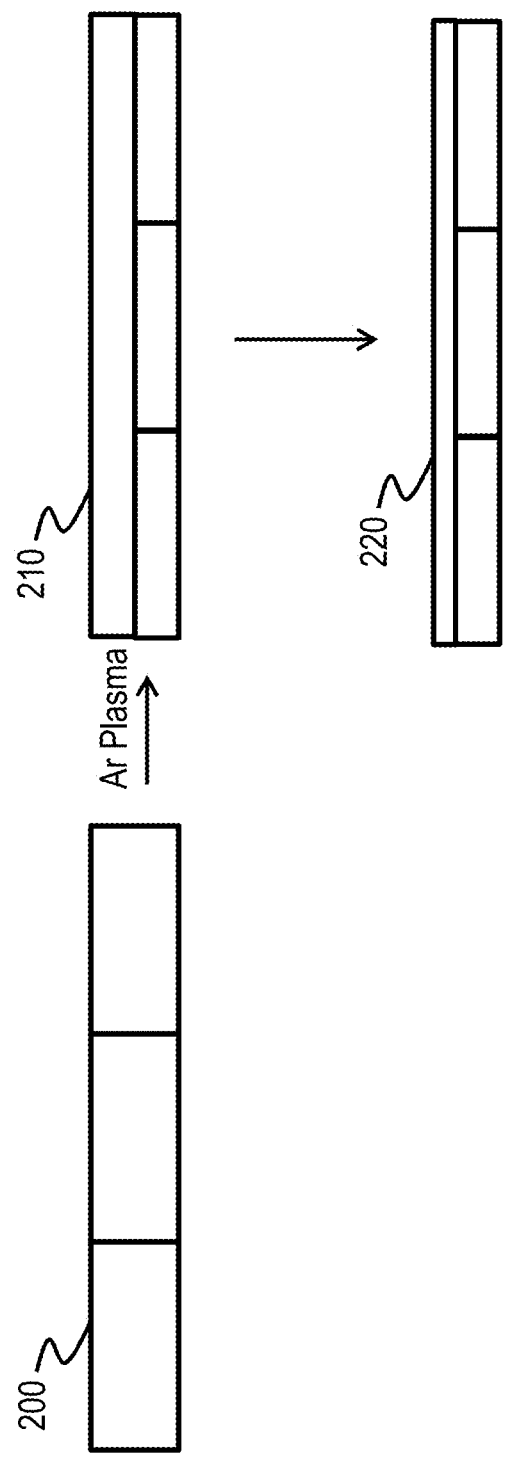
FIG. 2 shows a schematic of a method in accordance with one or more embodiments of the invention.

FIG. 2 illustrates another process similar to FIG. 1, but instead demonstrates only partial removal of the amorphous region. First, a polycrystalline substrate 200 is provided. Again, the polycrystalline substrate 200 is exposed to a plasma (e.g., Ar), which provides an amorphous region 210. The amorphous region 210 may be thicker than amorphous region 110. A part of amorphous region 210 is then etched leaving behind a remainder of the amorphous region 220 overlying the polycrystalline substrate 200. As with the process of FIG. 1, the etching process can be carried out, for example, by exposing the amorphous region 210 to $Br_2$ and TMEDA as discussed above.

Once an amorphous layer has been provided, all or part of the amorphous layer may be etched. Etching may be accomplished by first activating a surface of the amorphous layer, which may be done through exposure to a halide transfer agent, and then exposing a surface of the amorphous layer to a Lewis base or pi acid.

In accordance with one or more embodiments of the invention, the reagents comprise a Lewis base or pi acid. A "pi acid," as used herein, refers to a compound that, as a ligand, can accept electron density from a metal into empty pi orbitals as well as donate electron density to the metal via a sigma bond. A "Lewis base," as used herein, refers to a compound that, as a ligand, can donate an electron pair to a metal. There are several suitable reagents for the processes described herein.

In one or more embodiments, the Lewis base or pi acid comprises a chelating amine. In some embodiments, the chelating amine has a structure represented by:

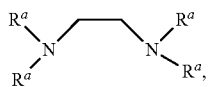

wherein each $R^a$ is independently hydrogen or C1-C4 alkyl group with the proviso that not all of the $R^a$ groups are hydrogen. In further embodiments, the chelating amine is selected from the group consisting of N,N,N',N'-tetramethylethylene diamine (also known as TMEDA), ethylene diamine, N,N'-dimethylethylenediamine, 2-(aminomethyl)pyridine, 2-[(alkylamino)methyl]pyridine, and 2-[(dialkylamino)methyl]pyridine, wherein the alkyl group is a C1-C6 alkyl group.

In some embodiments, the Lewis base or pi acid comprises CO, alkylphosphines ($PR^1_3$, wherein each $R^1$ is a C1-C6 alkyl group), 1,2-bis(difluorophosphino)ethane, $N_2O$, NO, $NH_3$, $NR^2_3$, wherein each $R^2$ is independently hydrogen or C1-C6 branched or unbranched, substituted or unsubstituted, alkyl, allyl or cyclic hydrocarbon or heteroatomic group, or a compound having the structure:

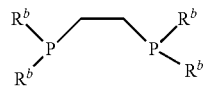

wherein each $R^b$ is independently hydrogen, R or C1-C4 alkyl. It is noted that $N_2O$ is not a traditional Lewis base, but does have a lone electron pair. In some embodiments, wherein the reagent comprises $NR^2_3$, each $R^2$ is independently C1-C6 alkyl. In other embodiments, at least one of the $R^2$ groups is cyclohexylamine.

In one or more embodiments, the pi acid comprises an aluminum precursor. In further embodiments, the aluminum precursor has formula $AlH_nX_mR^c_p$, wherein X is a halogen, the sum of n+m+p is 3, and $R^c$ is C1-C6 alkyl.

In one or more embodiments, the process includes activation of the substrate surface. In some embodiments, activation of the substrate surface provides a surface termination which will react with a Lewis acid and/or pi acid. In further embodiments, the surface termination will react with any one or more of the Lewis acids and/or pi acids.

In some embodiments, exposure to the substrate surface comprises exposing the substrate surface to a halide transfer agent. In one or more embodiments, exposure of the substrate surface to the halide transfer agent and any pi acid and/or Lewis base occurs sequentially or substantially sequentially As used herein, the phrase "exposure of the substrate surface to the halide transfer agent and the reagent occur substantially sequentially" means that the substrate surface is exposed to the halide transfer agent with a majority of the halide transfer agent exposure duration not coinciding with exposure to the reagent, although there may be some overlap. In some embodiments, exposure of the substrate surface to the halide transfer agent and any pi acid and/or Lewis base occurs simultaneously or substantially simultaneously. As used herein, "substantially simultaneously" means that the substrate surface is exposed to the halide transfer agent with a majority of the halide transfer agent exposure duration coinciding with exposure to the reagent, although there may be some time where the two do not overlap. Again, while not wishing to be bound to any particular theory, it is thought that exposure of the substrate surface to a halide transfer agent results in the substrate surface having halide surface terminations, which makes the substrate surface more reactive to one or more of the pi acids and/or Lewis bases described herein. In some embodiments, the halide transfer agent comprises a dihalide. In further embodiments, the dihalide comprises $I_2$, $Br_2$, $Cl_2$. In other embodiments, the halide transfer agent comprises a trialkylsilyl halide or an alkyl halide, wherein the alkyl group(s) of either the trialkylsilyl halide or alkyl halide may be a C1-C6 alkyl group. Examples of suitable alkyl halides include ethyliodide and diiodoethane.

The substrate surface will therefore be at least one atomic layer thinner than before the etch process. In some embodiments, the etch process is self-limiting. That is, each time an etch cycle is performed, the same amount of the substrate is removed, although not necessarily at the monolayer. For example, a certain number of Angstroms (e.g., about 7), or several monolayers may be removed per cycle. In these embodiments, one or more layers of transition metal atoms may be reliably removed each cycle. Such a method may be referred to as "alternating exposure etching," where the substrate surface is sequentially or substantially sequentially exposed to reagent and activation agents. As used herein "substantially sequentially" means that the majority of the duration of the pulses does not overlap with the pulse of co-reagent, although there may be some overlap. In other embodiments, the process may be self-limiting at the monolayer. That is, in such embodiments, only one layer of transition metal atoms is removed at a time. Such a process may be referred to as "atomic layer etching."

The specific reaction conditions for the etch reactions may be selected based on the properties of the reagents and substrate surface, as well as the pressure used. The etch may be carried out at atmospheric pressure, but may also be carried out at reduced pressure. The substrate temperature should be high enough to keep the formed metal complexes in the gaseous phase and to provide sufficient energy for surface reactions. The properties of the specific substrate, film precursors, etc. may be evaluated using methods known in the art, allowing selection of appropriate temperature and pressure for the reaction.

In some embodiments, the substrate surface temperature is kept below about 500, 475, 450, 425, 400, 375, 350, 325, or 300° C. In embodiments where the etch is utilized for cleaning buildup off of equipment, the substrate temperature may be kept below 250, 225, or 200° C. The substrate surface temperature should be at least about room temperature (23° C.) or at least about 25, 50 or 75° C.

Therefore, once the substrate is activated and a reagent gas has been flowed over the reactive surface, it is thought that the reagent gas forms a metal coordination complex with one or more of the transition metal atoms from the substrate surface. Ideally, the reaction conditions are chosen so that the formed coordination complex is volatile at a given temperature (i.e., in the vapor phase). Then, the complex may simply be flowed away from the substrate surface and, as appropriate, out of the chamber. That is, in some embodiments, the method further comprises purging the vapor phase coordination complex.

Another aspect of the invention also pertains to a method of etching a substrate. The method comprises providing a polycrystalline film comprising a transition metal. The method also comprises exposing the polycrystalline film to an inert plasma, reducing gas or reagent vapor. The method may then comprise exposing the polycrystalline film to a halide transfer agent to provide an activated substrate surface. The method may also comprise exposing the activated substrate surface to a reagent comprising a Lewis base or pi acid to provide a vapor phase coordination complex comprising one or more atoms of the transition metal coordinated to one or more ligands from the reagent.

While not wishing to be bound to any particular theory, it is thought that by periodically treating the material being etched with a reducing gas, plasma or reagent vapor the excess halogen can be removed from the film and a low surface roughness etch achieved. In addition to periodic treatment adding a pre-etch treatment can ensure a low surface roughness by removing surface oxidation. This periodic treatment can also remove residual etch residues from the etched surface. The pre-treatment and periodic treatment reagent can consist of mixtures and/or plasmas of the following $H_2$, $N_2$, $NH_3$, Ar, He. The treatment may also consist of mixtures of gases such as $H_2$, $N_2$, Ar, He with silyl amines. In further embodiments, such silyl amines include, but are not limited to, 1,4-bis(trimethylsilyl)-1,4-diaza-2,5-cyclohexadiene Exposure of the polycrystalline film to the inert plasma may therefore be carried out just once or multiple times. In some embodiments, exposure of the polycrystalline substrate to the inert plasma may occur before any of the polycrystalline substrate has been etched. Alternatively, or additionally, exposure of the polycrystalline substrate to the inert plasma may occur after some etching has taken place. The exposure of the polycrystalline substrate to the inert plasma may be repeated after a given number of etch cycles (e.g., every 30 cycles).

Any of the reagent, condition or substrate variations discussed above may be applied to this method, unless otherwise indicated. For example, in one or more embodiments, the Lewis base or pi acid comprises CO, $PR^1_3$, wherein each $R^1$ is independently a C1-C6 alkyl group, 1,2-bis(difluorophosphino)ethane, $N_2O$, NO, $NH_3$, $NR^2_3$, wherein each $R^2$ is independently hydrogen C1-C6 branched or unbranched, substituted or unsubstituted, alkyl, allyl or cyclic hydrocarbon or heteroatomic group, or a compound having the structure:

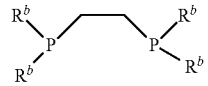

wherein each $R^b$ is independently hydrogen, R or C1-C4 alkyl. In some embodiments, the pi acid comprises $AlH_n X_m R^c_p$, wherein X is a halogen, the sum of n+m+p is 3, and $R^c$ is C1-C6 alkyl. In one or more embodiments, the Lewis base or pi acid comprises a chelating amine selected from the group consisting of N,N,N',N'-tetramethylethylene diamine, ethylene diamine, N,N'-dimethylethylenediamine, 2-(aminomethyl)pyridine, 2-[(alkylamino)methyl]pyridine, and 2-[(dialkylamino)methyl]pyridine, wherein the alkyl group is C1-C6 alkyl.

In one or more embodiments, the halide transfer agent is selected from the group consisting of $Cl_2$ and $Br_2$. In some embodiments, the polycrystalline film comprises cobalt. In one or more embodiments, the polycrystalline film comprises a metal selected from the group consisting of Co, Cu, Ru, Ni, Fe, Pt, Mn and Pd. In some embodiments, the plasma comprises $H_2$, $N_2$, $NH_3$, Ar and/or He.

Another aspect of the invention pertains to yet another method of etching a substrate. This method comprises activating a substrate surface comprising a polycrystalline film of a metal selected from the group consisting of Co, Cu, Ru, Ni, Fe, Pt, Mn and Pd, wherein activation of the substrate surface comprises exposing the substrate surface to $Br_2$ or $Cl_2$ to provide an activated substrate surface. Next, the method may comprise exposing the activated substrate surface to a reagent comprising TMEDA to provide a vapor phase coordination complex comprising one or more atoms of the Co, Cu, Ru, Ni, Fe, Pt, Mn or Pd coordinated to one or more ligands from the reagent, wherein the $Br_2$ is present in an amount effective to etch about one Angstrom of the substrate surface. While not wishing to be bound to any particular theory, it is thought that in such processes, the halide dose is reduced to a relatively small volume in which the halide is depleted on the surface and no excess remains to penetrate the grain boundaries. The time and pulse length may be varied to achieve the targeted etch rate.

In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during some of the processes disclosed herein, it should be noted that plasmas may not be featured in all embodiments.

One or more of the processes described herein include a purge. The purging process keeps the reagents separate. The substrate and chamber may be exposed to a purge after stopping the flow of one or more of the reagents. A purge gas may be administered into the processing chamber with a flow rate within a range from about 10 sccm to about 10,000 sccm, for example, from about 50 sccm to about 5,000 sccm, and in a specific example, about 1000 sccm. The purge removes any excess precursor, byproducts and other contaminants within the processing chamber. The purge may be conducted for a time period within a range from about 0.1 seconds to about 60 seconds, for example, from about 1 second to about 10 seconds, and in a specific example, from about 5 seconds. The carrier gas, the purge gas, the deposition gas, or other process gas may contain nitrogen, hydrogen, argon, neon, helium, or combinations thereof. In one example, the carrier gas comprises argon and nitrogen.

According to one or more embodiments, the substrate is subjected to processing prior to and/or after forming etch. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to a separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific processes as described herein. Other processing chambers which may be used include, but are not limited to, cyclical layer deposition (CLD), atomic layer deposition (ALD), chemical vapor deposition (CVD), physical vapor deposition (PVD), other etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the chamber to prevent reactants from moving from the chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or discreetly. For example, a substrate may be rotated throughout the entire process, or the substrate can be rotated by a small amount between exposure to different reactive or purge gases. Rotating the substrate during processing (either continuously or discreetly) may help produce a more uniform deposition or etch by minimizing the effect of, for example, local variability in gas flow geometries.

In atomic layer deposition-type chambers, the substrate can be exposed to the reagents and/or other compounds either spatially or temporally separated processes. Temporal ALD (or etch) is a traditional process in which the first precursor flows into the chamber to react with the surface. The first precursor is purged from the chamber before flowing the second precursor. In spatial ALD (or etch), both the first and second precursors are simultaneously flowed to the chamber but are separated spatially so that there is a region between the flows that prevents mixing of the precursors. In spatial ALD, the substrate is moved relative to the gas distribution plate, or vice-versa.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

EXAMPLES

Example 1—Cobalt Etch (Comparative)

Figure 3A:
FIGS. 3A-B show TEM photographs of a film etched using a comparative method and a film etched using a method in accordance with one or more embodiments of the invention, respectively.

A film of polycrystalline cobalt was provided. The polycrystalline cobalt was etched using $Br_2$ and N,N,N',N'-tetramethylethylenediamine (TMEDA). The reagents were present in an amount to result in about 8 Angstroms per cycle being etched. A transmission electron microscope (TEM) photograph showing the resulting etched surface is shown in FIG. 3A. As can be seen in the figure, the surface was etched at a higher rate at the grain boundaries, leaving valleys at the grain boundaries.

Example 2—Cobalt Etch with Reduced $Br_2$ Pulse

Figure 3B:
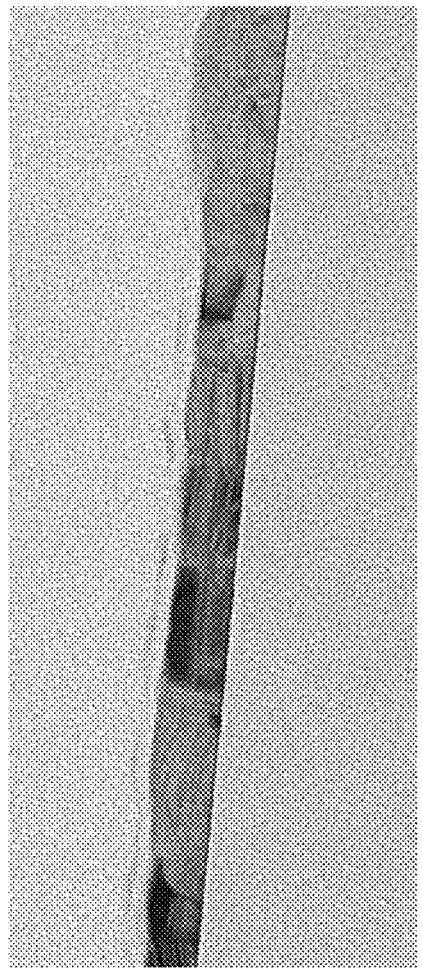

The etch process of Example 1 was repeated, except that the dose of $Br_2$ was reduced to delivery enough $Br_2$ to etch about 1 Angstrom per cycle. A TEM photograph showing the resulting etched surface is shown in FIG. 3B. As can be seen in the figure, the boundary effect was significantly mitigated, resulting in a much smoother etch.

What is claimed is:

1. A method comprising:
providing a polycrystalline film comprising a transition metal selected from the group consisting of Co, Cu, Ru, Ni, Fe, Pt, Mn and Pd, the polycrystalline film having a carbon content less than 10% on an atomic basis;
exposing the polycrystalline film to a plasma at a temperature in the range of about 23° C. to about 500° C. to amorphize at least a portion of the polycrystalline film to provide an amorphous region;
activating at least a portion of the polycrystalline film to provide an activated surface; and
etching at least a portion of the activated surface by exposing the activated surface to a reagent comprising a Lewis base or pi acid.

2. The method of claim 1, wherein etching the activated surface comprises creating a vapor phase coordination complex of the transition metal coordinated to one or more ligands from the reagent.

3. The method of claim 1, wherein the Lewis base or pi acid comprises a chelating amine represented by the structure:

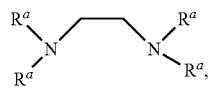

wherein each $R^a$ is independently hydrogen or C1-C4 alkyl group with the proviso that not all of the $R^a$ groups are hydrogen.

4. The method of claim 3, wherein the chelating amine is selected from the group consisting of N,N,N',N'-tetramethylethylene diamine (TMEDA), ethylene diamine, N,N'-dimethylethylenediamine, 2-(aminomethyl)pyridine, 2-[(alkylamino)methyl]pyridine, and 2-[(dialkylamino)methyl]pyridine, wherein the alkyl group is a C1-C6 alkyl group.

5. The method of claim 1, wherein the Lewis base or pi acid comprises CO, $PR^1_3$, wherein each $R^1$ is independently a C1-C6 alkyl group, 1,2-bis(difluorophosphino)ethane, $N_2O$, NO, $NH_3$, $NR^2_3$, wherein each $R^2$ is independently hydrogen C1-C6 branched or unbranched, substituted or unsubstituted, alkyl, allyl or cyclic hydrocarbon or heteroatomic group, or a compound having the structure:

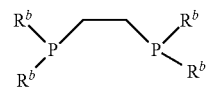

wherein each $R^b$ is independently hydrogen, R or C1-C4 alkyl.

6. The method of claim 1, wherein the pi acid comprises $AlH_nX_mR^c_p$, wherein X is a halogen, the sum of n+m+p is 3, and $R^c$ is C1-C6 alkyl.

7. The method of claim 1, wherein activating at least a portion of the polycrystalline film comprises exposing the polycrystalline film to a transfer agent selected from the group consisting of $Cl_2$, $Br_2$ and $I_2$.

8. The method of claim 1, wherein the polycrystalline film comprises cobalt.

9. The method of claim 1, further comprising repeating amorphizing, activating and etching the substrate.

10. A method of etching a substrate, the method comprising:
providing a polycrystalline film comprising cobalt;
amorphizing the polycrystalline film by exposing the polycrystalline film to an inert plasma, reducing gas or reagent vapor at a temperature in the range of about 23° C. to about 500° C.;
activating at least a portion of the amorphized polycrystalline film by exposing the amorphized polycrystalline film to a halide transfer agent selected from the group consisting of $Cl_2$, $Br_2$ and $I_2$ to provide an activated substrate surface; and
exposing the activated substrate surface to a reagent comprising a Lewis base or pi acid to provide a vapor phase coordination complex comprising one or more cobalt atoms coordinated to one or more ligands from the reagent.

11. The method of claim 10, wherein the Lewis base or pi acid comprises CO, $PR^1_3$, wherein each $R^1$ is independently a C1-C6 alkyl group, 1,2-bis(difluorophosphino)ethane, $N_2O$, NO, $NH_3$, $NR^2_3$, wherein each $R^2$ is independently hydrogen C1-C6 branched or unbranched, substituted or unsubstituted, alkyl, allyl or cyclic hydrocarbon or heteroatomic group, or a compound having the structure:

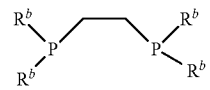

wherein each $R^b$ is independently hydrogen, R or C1-C4 alkyl.

12. The method of claim 10, wherein the pi acid comprises $AlH_nX_mR^c_p$, wherein X is a halogen, the sum of n+m+p is 3, and $R^c$ is C1-C6 alkyl.

13. The method of claim 12, wherein the Lewis base or pi acid comprises a chelating amine selected from the group consisting of N,N,N',N'-tetramethylethylene diamine, ethylene diamine, N,N'-dimethylethylenediamine, 2-(aminomethyl)pyridine, 2-[(alkylamino)methyl]pyridine, and 2-[(dialkylamino)methyl]pyridine, wherein the alkyl group is C1-C6 alkyl.

14. The method of claim 10, wherein the polycrystalline film further comprises one or more metal selected from Cu, Ru, Ni, Fe, Pt, Mn or Pd.

15. A method comprising:
    providing a polycrystalline film comprising a transition metal selected from the group consisting of Co, Cu, Ru, Ni, Fe, Pt, Mn and Pd, the polycrystalline film having a carbon content less than 10% on an atomic basis;
    exposing the polycrystalline film to a plasma at a temperature in the range of about 23° C. to about 500° C. to amorphize at least a portion of the polycrystalline film to provide an amorphous region;
    activating at least a portion of the polycrystalline film to provide an activated surface; and
    etching at least a portion of the activated surface by exposing the activated surface to a reagent comprising a Lewis base or pi acid comprises one or more of a chelating amine represented by the structure:

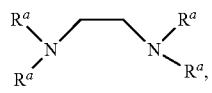

wherein each $R^a$ is independently hydrogen or C1-C4 alkyl group with the proviso that not all of the $R^a$ groups are hydrogen, CO, $PR^1_3$, wherein each $R^1$ is independently a C1-C6 alkyl group, 1,2-bis(difluorophosphino)ethane, $N_2O$, NO, $NH_3$, $NR^2_3$, wherein each $R^2$ is independently hydrogen C1-C6 branched or unbranched, substituted or unsubstituted, alkyl, allyl or cyclic hydrocarbon or heteroatomic group, or a compound having the structure:

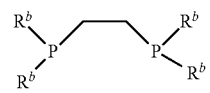

wherein each $R^b$ is independently hydrogen, R or C1-C4 alkyl, or the pi acid comprises $AlH_nX_mR^c_p$, wherein X is a halogen, the sum of n+m+p is 3, and $R^c$ is C1-C6 alkyl.

16. The method of claim 15, wherein the chelating amine is selected from the group consisting of N,N,N',N'-tetramethylethylene diamine (TMEDA), ethylene diamine, N,N'-dimethylethylenediamine, 2-(aminomethyl)pyridine, 2-[(alkylamino)methyl]pyridine, and 2-[(dialkylamino)methyl]pyridine, wherein the alkyl group is a C1-C6 alkyl group.

17. The method of claim 15, wherein activating at least a portion of the polycrystalline film comprises exposing the polycrystalline film to a transfer agent selected from the group consisting of $Cl_2$, $Br_2$ and $I_2$.

18. The method of claim 15, wherein the polycrystalline film comprises cobalt.

19. The method of claim 15, further comprising repeating amorphizing, activating and etching the substrate.

* * * * *